(12) United States Patent
Sakata et al.

(10) Patent No.: US 7,460,359 B2
(45) Date of Patent: Dec. 2, 2008

(54) THIN MULTI-TERMINAL CAPACITOR AND METHOD OF MANUFACTURING THE SAME

(75) Inventors: Koji Sakata, Sendai (JP); Katsuhiro Yoshida, Sendai (JP); Yoshitaka Hori, Sendai (JP); Tomohide Date, Sendai (JP)

(73) Assignee: NEC Tokin Corporation, Sendai-shi (JP)

( * ) Notice: Subject to any disclaimer, the term of this patent is extended or adjusted under 35 U.S.C. 154(b) by 324 days.

(21) Appl. No.: 11/359,835

(22) Filed: Feb. 22, 2006

(65) Prior Publication Data

US 2006/0193105 A1    Aug. 31, 2006

(30) Foreign Application Priority Data

Feb. 28, 2005  (JP)  ............................. 2005-053804

(51) Int. Cl.
    *H01G 9/04*  (2006.01)
    *H01G 9/145* (2006.01)
(52) U.S. Cl. ................... 361/528; 361/532; 29/25.03
(58) Field of Classification Search ................ 361/523, 361/528–529, 532–540; 29/25.03
    See application file for complete search history.

(56) References Cited

U.S. PATENT DOCUMENTS

| | | | | |
|---|---|---|---|---|
| 6,466,430 B2 * | 10/2002 | Mido et al. | ................. | 361/529 |
| 6,510,045 B2 * | 1/2003 | Mido et al. | ................. | 361/529 |
| 6,917,514 B2 * | 7/2005 | Mido et al. | ................. | 361/533 |
| 7,009,834 B2 * | 3/2006 | Arai et al. | ................... | 361/538 |
| 2004/0130856 A1 * | 7/2004 | Fujii et al. | .................. | 361/523 |
| 2004/0130857 A1 * | 7/2004 | Miki et al. | .................. | 361/523 |
| 2005/0047062 A1 * | 3/2005 | Mido et al. | ................. | 361/523 |
| 2005/0117279 A1 * | 6/2005 | Kobayashi et al. | .......... | 361/523 |

FOREIGN PATENT DOCUMENTS

| | | |
|---|---|---|
| JP | 2004-71589 A | 3/2004 |
| JP | 2004-80733 A | 3/2004 |

* cited by examiner

*Primary Examiner*—Eric Thomas
(74) *Attorney, Agent, or Firm*—Frishauf, Holtz, Goodman & Chick, P.C.

(57) ABSTRACT

The capacitor element includes as an anode an aluminum foil in the form of a thin plate, an oxide layer formed as a dielectric on the surface of the anode, and a conductive polymer layer formed as a cathode on the dielectric. The capacitor is formed by drawing terminals in arrays from the capacitor element. On the upper side of the capacitor element is provided an embossed copper foil 11 for suppressing deformation of the capacitor element. The anode terminals and the cathode terminals are drawn to the lower side of the capacitor element. The anode terminals and the cathode terminals are alternately formed at the same pitch in the x-direction and the y-direction, so that the heteropolar terminals are disposed at the adjacent positions with respect to any one of the terminals.

16 Claims, 8 Drawing Sheets

THIN MULTI-TERMINAL CAPACITOR AND METHOD OF MANUFACTURING THE SAME

This application claims priority to prior Japanese Patent Application JP 2005-053804, the disclosure of which is incorporated herein by reference.

BACKGROUND OF THE INVENTION

This invention relates to a thin multi-terminal capacitor for use in stabilizing a power supply voltage of an electronic device and reducing high-frequency noise thereof and a method of manufacturing such a capacitor and, in particular, relates to a thin multi-terminal capacitor suitable to be disposed and operated inside or near a semiconductor plastic package and a method of manufacturing such a capacitor.

In microprocessors, digital signal processing LSIs, or the like for use in personal computers, servers, digital household electric appliances, communication devices, and so on, the operating speed has been increasing in recent years, wherein a capacitor with a large capacitance and a low impedance is used in a power circuit for stabilizing the power supply voltage and reducing the high-frequency noise. In order to satisfy such requirement for the large capacitance and low impedance, a plurality of capacitors may be connected in parallel so as to achieve a required capacitance and impedance. On the other hand, Japanese Unexamined Patent Application Publication JP-A 2004-80733 discloses a technique of forming a transmission line type noise filter that realizes the large capacitance and low impedance with a single element and can withstand high current.

However, when the transmission line type noise filter described in JP-A 2004-80733 is used in a high-frequency region of several GHz or more, the inductance caused by wiring between a semiconductor device and the transmission line type noise filter exerts an influence. Further, when the transmission line type noise filter is used so as to be connected to a solder ball connection type semiconductor device, the inductance caused by wiring between the semiconductor device and the transmission line type noise filter exerts an influence even if used in a frequency region not exceeding several GHz. In order to avoid such an increase in inductance due to the drawing of wiring to achieve a reduction in impedance in the mounted state, it is necessary to implement precise positioning between electrode terminals of the transmission line type noise filter and power supply terminals of the semiconductor device so that difficulties are encountered in the mounting.

As a capacitor capable of avoiding the increase in inductance due to the drawing of wiring, there is a capacitor of the type that can be used while disposed inside or near a plastic package of a semiconductor device. For example, Japanese Unexamined Patent Application Publication JP-A 2004-71589 discloses a thin-film capacitor that is adapted to be incorporated in a wiring board or a semiconductor integrated circuit and has a structure of relaxing the internal stress so that the initial properties of the capacitor immediately after the fabrication thereof does not change even after the incorporation. This capacitor has a resonant frequency of several GHz or more and serves as a highly reliable decoupling capacitor.

However, JP-A2004-71589 discloses the technique that is applicable to a thin-film capacitor using a capacitance insulating film typically made of $Ta_2O_3$, $SrTiO_3$, or the like. Specifically, this thin-film capacitor contributes to a reduction in power supply noise as a decoupling capacitor but has a capacitance of only about 1000 pF and, therefore, should be used along with large-capacitance capacitors in order to cope with noise caused by fluctuation in power supply voltage. Since it is impossible to place all those large-capacitance capacitors in a semiconductor plastic package, most of them are left on a board. Therefore, it is necessary to dispose, in the semiconductor package, a capacitor having a capacitance necessary for preventing a time delay in charge supply from a power supply due to the inductance caused by drawing of wiring between the capacitors on the board and a semiconductor device in the semiconductor package.

Further, as seen also from JP-A2004-71589, in order to cope with the high-frequency region of several GHz or more, it is not enough only to dispose the capacitor inside or near the semiconductor package but it is also necessary to reduce the thickness of the capacitor as much as possible so as to minimize drawing of wiring. However, when the structure is thin, it is weak against bending stress and, at the time of mounting by reflow soldering or the like, degradation in properties, such as an increase in leakage current (LC), tends to occur due to heat stress or the like.

SUMMARY OF THE INVENTION

Under these circumstances, it is an object of this invention to provide a thin multi-terminal capacitor having a large capacitance and low impedance and capable of maintaining the stable properties even after the mounting, and further provide a method of manufacturing such a capacitor.

For accomplishing the foregoing object, a thin multi-terminal capacitor of this invention uses a capacitor element wherein an increase in capacitance is achieved by using a valve-acting metal in the form of a thin plate, the terminal drawing arrangement is such that anode terminals and cathode terminals are alternately arranged at the same pitch, and an increase in inductance due to drawing of wiring is avoided, and the capacitor further comprises a reinforcing plate disposed on at least one side of the capacitor element.

That is, the thin multi-terminal capacitor of this invention is formed by drawing terminals in arrays from a capacitor element in the form of a thin plate, the capacitor element comprising as an anode a valve-acting metal in the form of a thin plate, an oxide layer formed as a dielectric on a surface of the anode, and a solid electrolyte of a conductive polymer or a metal oxide semiconductor formed as a cathode on the dielectric, wherein a reinforcing plate for suppressing deformation of the capacitor element is provided on at least one side of the capacitor element. By using the valve-acting metal, the capacitance is increased. The capacitor having the terminals drawn in arrays is disposed close to a semiconductor device, thereby achieving a reduction in impedance. Further, the reinforcing plate is disposed on at least one side of the capacitor element.

The terminals are formed on one side of the capacitor element and, with respect to an x-axis and a y-axis perpendicular to each other in a plane, the anode terminals and the cathode terminals are alternately formed at the same pitch along the x-axis and, with respect to any one of the terminals on the x-axis, the anode terminals and the cathode terminals are alternately formed in directions of the y-axis at the same pitch equal to the pitch on the x-axis, so that the heteropolar terminals are disposed at adjacent positions with respect to any one of the terminals. That is, the inductance can be reduced by alternately disposing the positive and negative terminals and, therefore, it is possible to form the capacitor whose impedance is small in a high-frequency region. Since the impedance in the high-frequency region is small, it is possible to fully cope with a solder ball connection type semiconductor device that operates at high frequency. Based on this terminal arrangement structure, the reduction in impedance is achieved to thereby cope with the solder ball connection type semiconductor device.

The reinforcing plate has a size that covers substantially the whole surface of the capacitor element on one side, thereby suppressing the deformation of the capacitor element.

The reinforcing plate is a reinforcing electrode plate serving also as the electrode terminals. This enables two functions by the single plate so that the overall structure can be simplified.

A material of the reinforcing electrode plate is preferably copper. By the use of this material, not only electrical conductivity but also proper rigidity are ensured.

The valve-acting metal is aluminum and the reinforcing electrode plate has a thickness of 25 to 500 μm. Aluminum is used to ensure a large capacitance. The thickness of the reinforcing electrode plate is set in the specified range so as not to cause degradation of the oxide layer of the anode body. This thickness ensures a proper rigidity while raises no practical problem in terms of the mounting or the like.

The reinforcing electrode plate is a copper plate or a copper foil having embossed portions arranged at regular intervals and convex portions of the embossed portions are fitted into holes formed in the capacitor element at regular intervals, thereby forming electrodes drawn to a surface on the opposite side. This makes it possible to alternately arrange the anode terminals and the cathode terminals at regular intervals on one surface of the capacitor element.

The reinforcing plate is a composite plate having a thickness of 25 to 500 μm and composed of a copper plate or a copper foil and an insulating resin. This ensures the electrical continuity as the electrode and the reinforcing function by the use of the copper plate or copper foil and further ensures the insulation on the surface by the use of the insulating resin.

According to one aspect of the invention, there is obtained a thin multi-terminal capacitor comprising a stacked structure having an anode made of a valve-acting metal in the form of a thin plate, an oxide layer formed on a surface of the valve-acting metal, and a cathode including a solid electrolyte layer of a conductive polymer or a metal oxide semiconductor formed on the oxide layer, and multi-terminal electrodes having the anode terminal electrodes and the cathode terminal electrodes that are arranged in arrays on one surface of the stacked structure, the thin multi-terminal capacitor further comprising a conductive reinforcing plate disposed on at least one side of the stacked structure for suppressing deformation of the thin multi-terminal capacitor.

Preferably, in a plane including an x-axis and a y-axis perpendicular to each other, the anode terminal electrodes and the cathode terminal electrodes are alternately disposed in the x-direction at the same interval and the anode terminal electrodes and the cathode terminal electrodes are alternately disposed in the y-direction at the same interval equal to the interval in the x-direction so that the terminal electrodes adjacent to the anode terminal electrodes and the cathode terminal electrodes are the heteropolar terminal electrodes.

Preferably, either of the anode terminal electrodes and the cathode terminal electrodes includes projecting portions of the reinforcing plate embossed in arrays and disposed in through holes formed across the stacked structure and arranged in arrays.

Preferably, in case of the anode terminal electrodes embossed, the stacked structure comprises a second conductive reinforcing plate disposed on a side opposite to the reinforcing plate and an insulating resin thin film formed on the second reinforcing plate, and the cathode terminal electrodes are formed in via holes formed in the insulating resin thin film.

In case of the cathode terminal slectrodes emobossed, the cathode terminal electrodes are disposed in through holes formed across the stacked structure and arranged in arrays. Further, the stacked structure comprises a second conductive reinforcing plate disposed on a side opposite to the reinforcing plate and an insulating resin thin film formed on the second reinforcing plate and the anode terminal electrodes are formed in via holes formed in the insulating resin thin film.

In accordance with another aspect of the invention, a method of manufacturing a thin multi-terminal capacitor comprises the steps of: forming holes at regular intervals in a valve-acting metal plate having oxide layers formed on both surfaces thereof; filling said holes with a first resist resin; forming a mask layer covering said first resist resin; forming a conductive polymer layer on an exposed surface of one of said oxide layers; stripping said mask layer to expose surfaces of said first resist resin; and connecting, via a silver paste layer, a composite foil composed of a first copper foil and an insulating resin film such that said first copper foil faces toward said conductive polymer layer, said first copper foil formed with through holes arranged corresponding to the surfaces of said first resist resin, and said insulating resin film formed with holes arranged corresponding to the positions of said through holes and middle points between the adjacent through holes. The method further comprises the steps of filling the holes provided in a composite layer including said insulating resin film, said first copper foil, said silver paste layer, and said conductive polymer layer stacked together, with a second resist resin whose material is the same as that of said first resist resin; removing the other of said oxide layers on a side of said valve-acting metal plate opposite to said conductive polymer layer to thereby expose a valve-acting metal core; forming through holes each at the center of said first and second resist resins; and sticking a second copper foil having concave-convex portions formed by emboss processing corresponding to the positions of said through holes, to an exposed surface of said valve-acting metal via a silver paste layer at a flat portion of said second copper foil such that said concave-convex portions of said second copper foil are inserted into the through holes provided in a composite layer including said insulating resin film, said first copper foil, said silver paste layer, said conductive polymer layer, said oxide layer, and said valve-acting metal core.

In this invention, since the oxide layer of the valve-acting metal in the form of the thin plate is used as the dielectric of the capacitor, it is easy to increase the capacitance. Further, since the reinforcing plate is disposed on at least one side of the capacitor element in the form of the thin plate, it is possible to prevent degradation in properties, such as an increase in leakage current, caused by external stress applied at the time of the fabrication or mounting. Further, since the capacitor element is in the form of the thin plate and the terminal drawing structure is such that the anode terminals and the cathode terminals are alternately arranged at the same pitch, a reduction in inductance is enabled.

BRIEF DESCRIPTION OF THE DRAWINGS

FIGS. 1A and 1B show a thin multi-terminal capacitor according to a first embodiment of this invention, wherein FIG. 1A is an exemplary sectional view of the capacitor and FIG. 1B is an external perspective view of the capacitor;

FIGS. 2A to 2D are sectional views showing the manufacturing processes of the thin multi-terminal capacitor according to the first embodiment, wherein FIG. 2A shows an aluminum foil provided with aluminum oxide layers obtained by forming etching layers on both sides and then carrying out a chemical conversion treatment, FIG. 2B shows an anode perforation process, FIG. 2C shows a process of, after a chemical conversion treatment again, filling anode holes with a resist resin, and FIG. 2D shows a mask forming process to cover only the surface of the resist resin;

FIGS. 3A to 3C are sectional views showing the processes of the first embodiment, wherein FIG. 3A shows a conductive polymer layer forming process, FIG. 3B shows a mask stripping process, and FIG. 3C shows a cathode forming process;

FIGS. 4A to 4C are sectional views showing the processes following FIG. 3C of the first embodiment, wherein FIG. 4A shows a hole filling process of second anode holes, FIG. 4B shows an anode drawing process, and FIG. 4C shows an anode through hole forming process;

FIGS. 5A and 5B are sectional views showing the processes following FIG. 4C of the first embodiment, wherein FIG. 5A shows an anode terminal forming process and FIG. 5B shows the state where solder balls are disposed at anode and cathode terminals;

FIGS. 10A and 10B show examples of using the thin multi-terminal capacitor of this invention, wherein FIG. 10A is an exemplary diagram showing the case where the capacitor is disposed along with a semiconductor device in the same plane and FIG. 10B is an exemplary diagram showing the case where the capacitor is disposed right under a semiconductor device via an interposer.

DESCRIPTION OF THE PREFERRED EMBODIMENTS

Now, embodiments of this invention will be described with reference to the drawings.

Figure 1A:
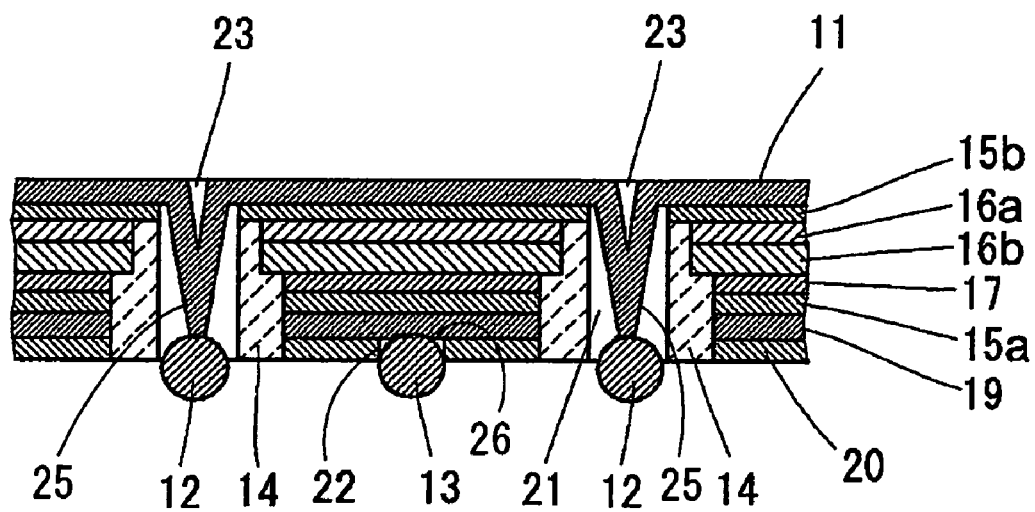
Figure 1B:
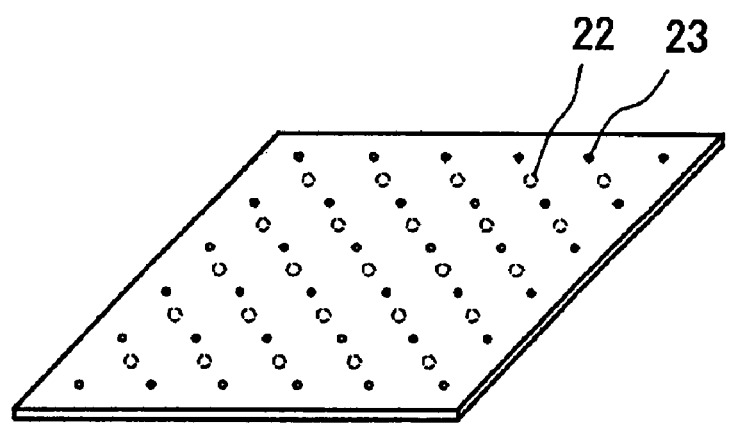

FIGS. 1A and 1B show a thin multi-terminal capacitor according to the first embodiment of this invention, wherein FIG. 1A is an exemplary sectional view of the capacitor and FIG. 1B is an external perspective view of the capacitor as seen from its terminal side. Numeral 11 denotes an embossed copper foil, 12 a solder ball of a positive (+) terminal (anode terminal), 13 a solder ball of a negative (−) terminal (cathode terminal), 14 a through-hole insulating resin, 15a and 15b silver paste layers, 16a an aluminum foil core, 16b an alminum oxide layer formed in an inner hole of an aluminum foil etching layer, 17 a conductive polymer layer, 19 a copper foil, 20 an insulating resin, 21 a through hole for an anode, 22 a cathode-terminal via hole formed in the insulating resin 20, 23 an embossed portion, 25 an anode terminal, or a protruding part embossed on a surface of the copper foil 11, and 26 a cathode terminal, or a portion of the copper foil forming the bottom of the via hole 22. In the embodiments of this invention, the cathode terminal (negative terminal) and the anode terminal (positive terminal) are used in the meaning of a current flow-in terminal and a current flow-out terminal, respectively, which may also be called a cathode terminal electrode and an anode terminal electrode, respectively. In this connection, a combination of the protruding part 25 and the solder ball 12 may be called an anode terminal while a combination of the portion 26 of the copper foil 19 and the solder ball 13 may be called a cathode terminal. Moreover, the solder ball 12 and the solder ball 13 may be referred to as an anode terminal and a cathode terminal, respectively. In the following description, the anode terminal and the cathode terminal are interchangeably used to indicate any of the above-mentioned manners or similar parts.

In this first embodiment, the copper foils are provided as reinforcing plates on both sides of the capacitor element and, therefore, the capacitor can be used without being subjected to degradation in properties due to mechanical stress or heat stress caused by a mounter or the like at the time of the mounting. The terminals 12 and 13 are not limited to the solder balls and may be formed by bumps or plating. Further, the layers 15a and 15b are not limited to the silver paste and may be made of other conductive paste such as copper paste or copper paste with silver coating.

In order to explain the overall structure in detail, a typical example will be given about the thicknesses of the respective layers. The insulating resin 20 is set to 35 μm, the copper foil 19 to 35 μm, the silver paste layer 15a to 10 μm, the conductive polymer layer 17 of polythiophene, polypyrrole, or the like to 10 μm, the aluminum foil core 16a and the aluminum foil etching layer in total to 60 μm, the silver paste layer 15b to 5 μm, and the embossed copper foil 11 to 70 μm. These layers are continuous except at the anode through holes 21. In FIG. 1A, the layers having the same hatching and shown at the same height position are continuous with each other. Further, the anode through holes 21 are located at the same positions as the embossed portions 23 in FIG. 1B and disposed at square lattice points, while, the cathode terminal via holes 22 where the negative terminal solder balls 13 are located are disposed at other square lattice points. Further, the cathode lattice points are each located at the center of the corresponding anode square lattice. That is, when defined in terms of x and y coordinates, each cathode terminal via hole is disposed at a position having an x-coordinate of a middle point between the adjacent x-direction anode through holes and a y-coordinate of a middle point between the adjacent y-direction anode through holes. Further, the positive terminal solder balls 12 are each disposed at a tip portion of the embossed copper foil 11 inserted in the corresponding anode through hole 21.

When observing the overall terminal arrangement as described above, the positive and negative terminals are alternately formed at the same pitch along the x-axis in the plane and, with respect to any one of the terminals along the x-axis, the positive and negative terminals are alternately formed in the directions of the y-axis perpendicular to the x-axis at the same pitch equal to the pitch along the x-axis, so that the heteropolar terminals are disposed at the adjacent positions with respect to any one of the terminals. By alternately disposing the positive and negative terminals, there is an effect of canceling magnetic fields that are generated when the current flows. Further, since the current disperses by disposing the large number of terminals, the magnetic flux density also decreases. Therefore, by alternately disposing the large number of positive and negative terminals, the inductance is reduced based on the synergistic effect of both of them.

Now, a manufacturing method of the foregoing capacitor will be described with reference to FIG. 2A to FIG. 7. FIGS. 2A to 2D are sectional views showing the manufacturing processes of the thin multi-terminal capacitor according to the first embodiment. FIG. 6 is a plan view showing the positions of first anode holes 31.

Figure 2A:
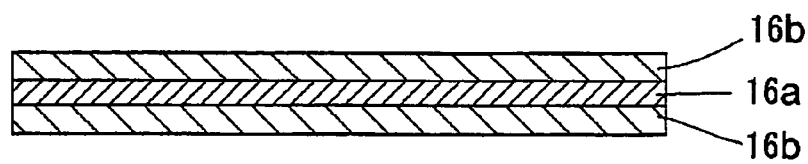

Description will be given in order of the processes. FIG. 2A shows an aluminum foil provided with aluminum oxide layers obtained by forming etched layers on both sides and then carrying out a chemical conversion treatment. The aluminum foil including the etched layers has a thickness of about 100 μm.

Figure 2B:
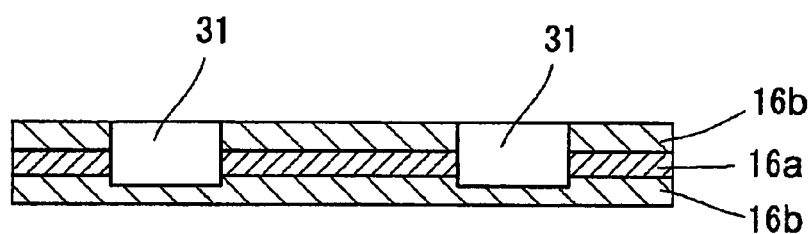

FIG. 2B shows an anode perforation process, wherein bottomed holes or through holes each having a diameter of 0.8 mm and a depth of about 70 μm are opened in the aluminum foil by the use of a drill or the like. The figure shows the case where the bottomed holes are opened.

Figure 2C:
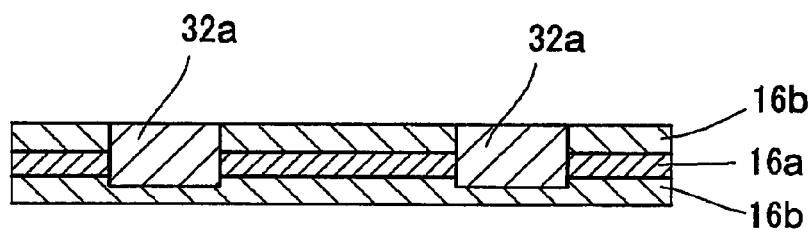

FIG. 2C shows a process of, after a chemical conversion treatment again, filling the anode holes with a resist resin, wherein the first anode holes 31 are filled with the resist resin 32a to make the surface flat. The resist resin can be an epoxy resin and serves to prevent short of the aluminum foil core 16a, which becomes the anode, when forming the conductive polymer layer 17 which becomes the cathode.

Figure 2D:
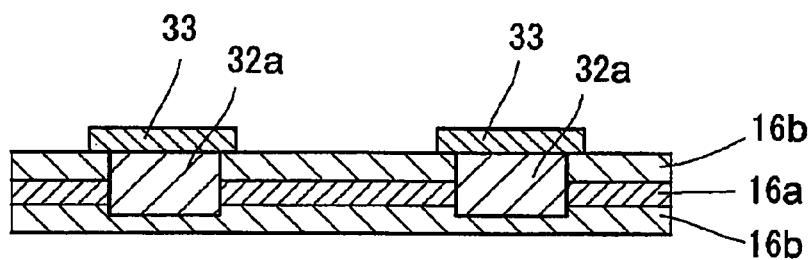

FIG. 2D shows a mask forming process to cover only the surfaces of the resist resin, wherein the thickness of a mask layer 33 is about 20 μm. As a material of the mask, use is made of masking tape or a rubber masking material.

Now, the subsequent processes will be described with reference to sectional views of FIGS. 3A to 3C.

Figure 3A:
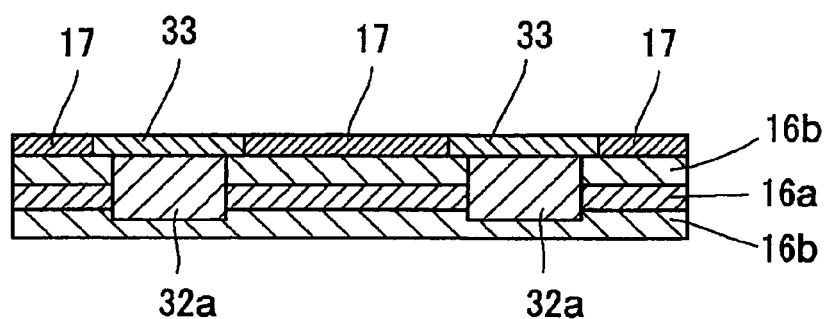

FIG. 3A shows a conductive polymer layer forming process, wherein the conductive polymer layer 17 is formed on the surface of the aluminum oxide layer 16b exposed from the mask layers 33.

Figure 3B:
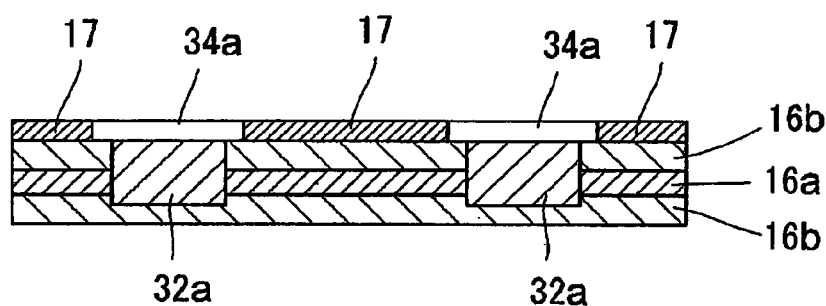

FIG. 3B shows a mask stripping process, wherein the mask layers 33 are removed so that holes 34a are formed there. The mask is removed by stripping the masking tape or using a mask stripping solvent.

Figure 3C:
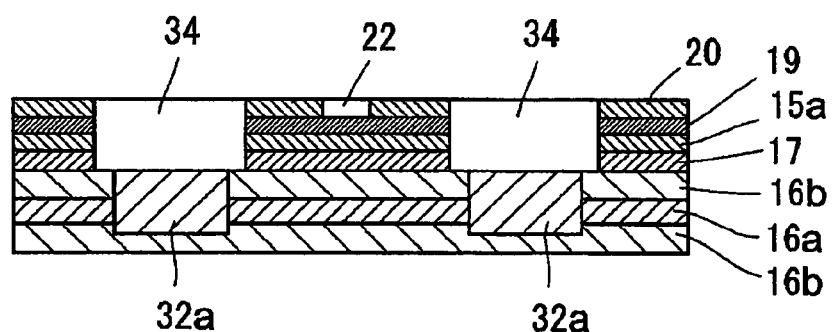

In FIG. 3C showing a cathode forming process, a composite layer is prepared, in which the copper foil 19 formed with holes corresponding to the holes 34a and the insulating resin 20 formed with holes corresponding to the holes 34a and the cathode terminal via holes 22 are stacked together. The composite layer is stacked on the conductive polymer layer 17 via the silver paste layer 15a. In this event, second anode holes 34 are formed on the resist resin 32a filled in the first anode holes. In this arrangement, the copper foil 19 serves as cathode terminals or cathode terminal electrodes in the portions of the copper foil forming bottoms of the via holes 22.

Figure 4A:
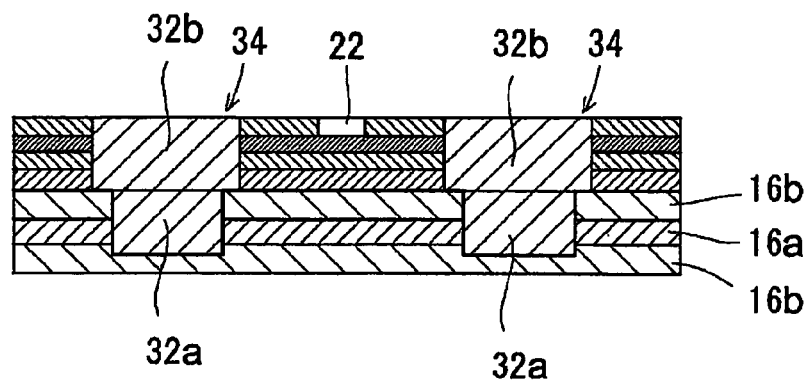
Figure 4B:
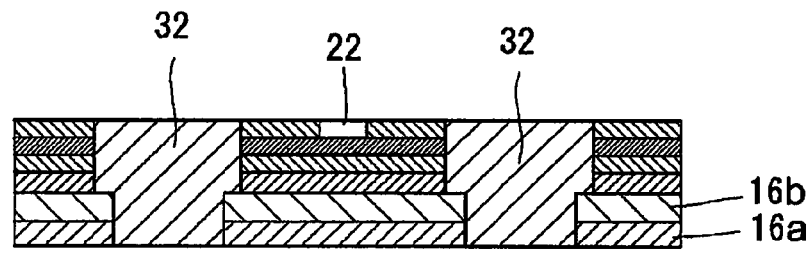
Figure 4C:
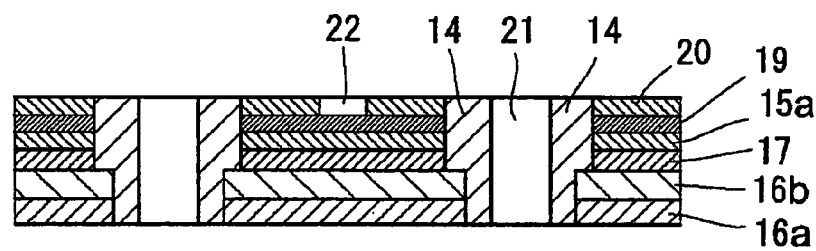

FIGS. 4A to 4C are sectional views showing the subsequent processes, wherein FIG. 4A shows a hole filling process of the second anode holes 34. A material of a resist resin 32b is the same as that of the resist resin 32a filled on the lower side.

FIG. 4B shows an anode exposing process. The aluminum oxide layer 16b in the lower part of the aluminum foil is removed by laser processing so that the aluminum foil core 16a is exposed to the lower side. The aluminum foil core 16a is wholly or partly exposed (the figure shows the case where the aluminum foil core is wholly exposed). Numeral 32 denotes a resist resin in which the resist resin 32a and the resist resin 32b are integrated together.

Figure 7:
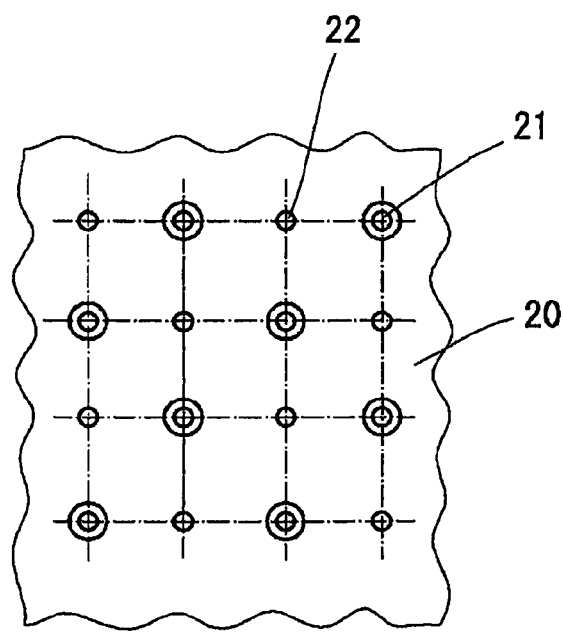
FIG. 7 is a plan view showing the arrangement of anode through holes and cathode terminal via holes.

FIG. 4C shows an anode through hole forming process, wherein the anode through holes 21 are each formed at the center of the integrated resist resin 32 so that the through-hole insulating resin 14 is formed as a side wall thereof. In FIG. 7, the arrangement of the anode through holes 21 and the cathode terminal via holes 22, viewed from the top of FIG. 4C, is shown. Numeral 20 denotes the insulating resin.

Figure 5A:
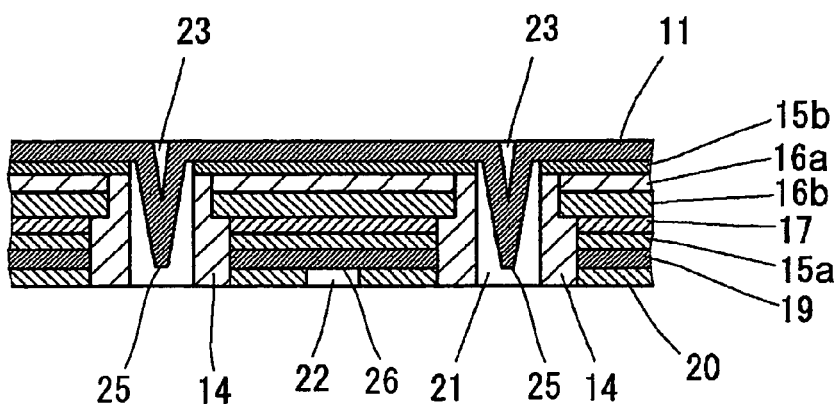
Figure 5B:
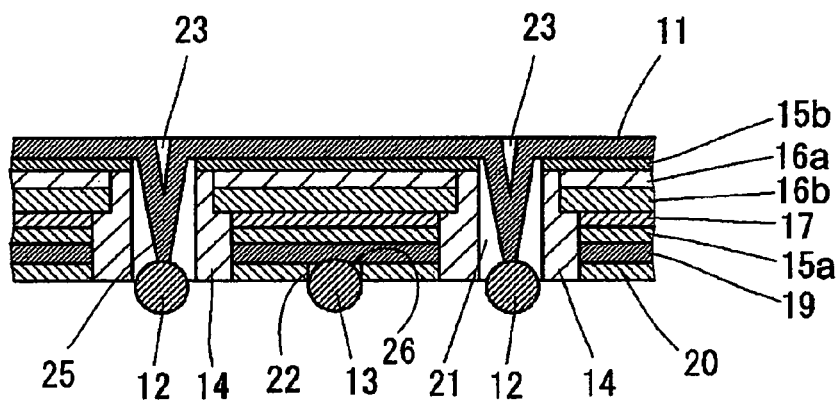
Figure 6:
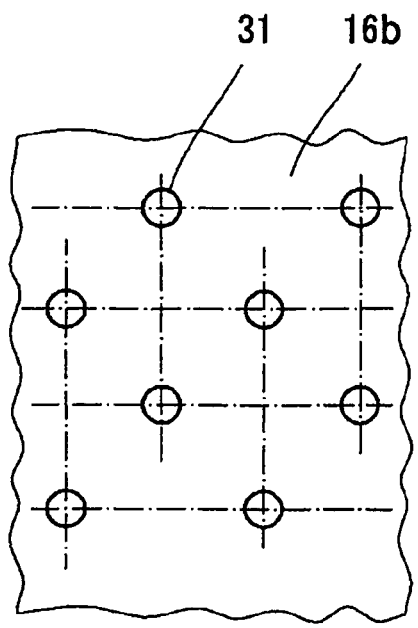
FIG. 6 is a plan view, as seen from above FIG. 2B, showing the positions of first anode holes in the first embodiment.

FIGS. 5A and 5B are sectional views showing the subsequent processes. FIG. 5A shows an anode terminal forming process, wherein emboss processing with a diameter of about 0.2 mm and a depth of about 120 μm is applied at each of the embossed portions 23 of the copper foil 11 and the embossed copper foil 11 is connected to the aluminum foil core 16a via the silver paste layer 15b by inserting the embossed convex portions into the anode through holes 21. In this manner, the thin multi-terminal capacitor is fabricated. In FIG. 5A, the element of FIG. 4C is shown upside down.

FIG. 5B shows the state where the solder balls 12 are disposed at the anode terminals in the form of the embossed convex portions and the solder balls 13 are disposed in the cathode terminal via holes 22 when mounting the capacitor onto a board such as a plastic package.

Description will be further made about the embossed copper foil 11 used herein. As a technique of drawing an electrode from one surface of a plate-like capacitor element to a surface on the opposite side, it is generally known to fill a through hole with conductive paste or draw an electrode by copper plating. However, both have defects. For example, in the case where a conductor is formed by the copper paste, the resistance increases when exposed to a highly humid atmosphere for a long time, while, cracks are generated inside the conductor due to stress at the time of reflow soldering so that the resistance increases. On the other hand, in the case of the copper plating, the capacitor properties are degraded due to invasion of the copper plating into the inside of the capacitor element. In contrast, in the case of using the embossed copper foil of this invention, because of the metal material, it is possible to easily solve the problem of the change in resistance in the highly humid atmosphere caused in the conductive paste and the problem of the cracks generated inside the conductor at the time of reflow soldering in the case of the copper plating. This technique of using the embossed copper foil is quite effective for stress relaxation at the time of reflow soldering and thus contributes to improving the mounting reliability. In FIG. 5B, a gap exists between the embossed copper foil 11 and the through-hole insulating resin 14 (insulating layer). In the figure, this gap is identified as 21 (anode through hole). Since the embossed copper foil is fitted after the through hole is formed, the gap exists practically. The existence of this gap has an important meaning. When observing in the horizontal direction on the mounting side where the solder balls 12 are disposed, the plurality of materials are present. Since the through-hole insulating resin 14 around the through hole and the metal material such as the aluminum foil core 16a have a particularly large difference in thermal expansion coefficient, this difference becomes a major cause for warpage at the time of reflow soldering or a major cause for a reduction in connection reliability under temperature cycle environment. In this invention, this can be relaxed by providing the gap between the resist layer (through-hole insulating resin 14) and the embossed copper foil 11. As a result of the electrical continuity between both surfaces achieved by the use of the embossed copper foil, it is advantageous in manufacturing yield and reliability.

Figure 10A:
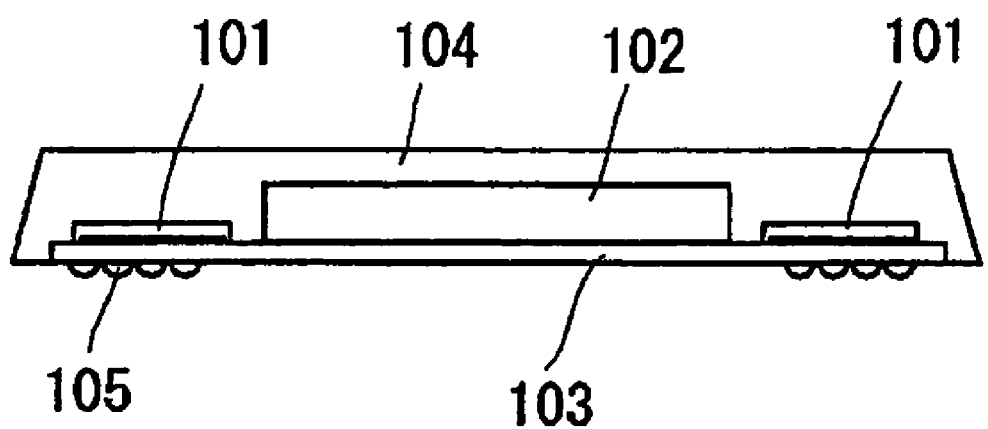
Figure 10B:
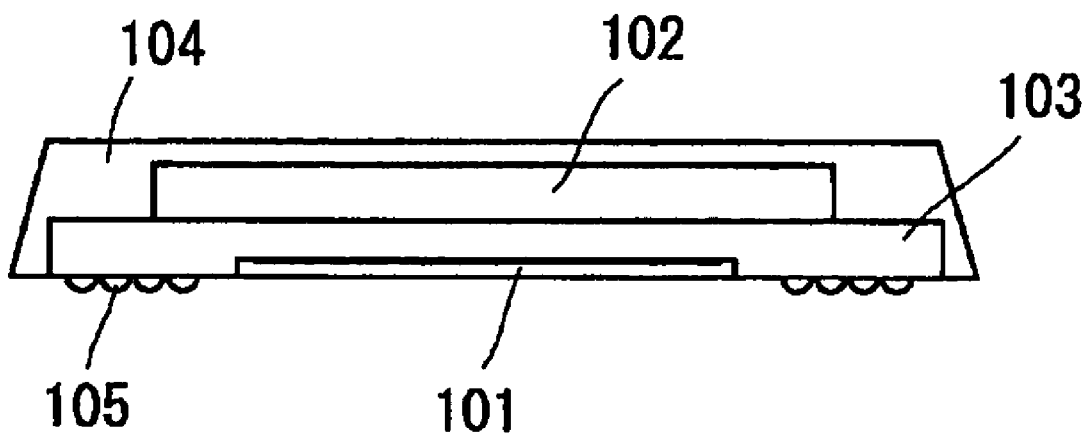

FIGS. 10A and 10B show examples of use of the thin multi-terminal capacitor thus fabricated. In the figures, numeral 101 denotes the thin multi-terminal capacitor of this invention, 102 a semiconductor device, 103 an interposer, 104 a casing resin of the semiconductor device, and 105 solder balls for connection to a printed wiring board. The thin multi-terminal capacitor 101 is connected to a power supply line of the semiconductor device 102 via the interposer 103. As the mounting manners, there are the case where the capacitor 101 is disposed along with the semiconductor device 102 in the same plane as shown in FIG. 10A and the case where the capacitor 101 is disposed right under the semiconductor device 102 via the interposer 103. Prior to the disposition, the connections of respective anode terminals are made to a common positive line while respective cathode terminals are connencted to a common ground line. These lines are connected to power supply lines. By disposing the thin multi-terminal capacitor close to the semiconductor device in this manner, the inductance due to wiring can be reduced so that it becomes possible to perform sufficient power feeding to the semiconductor device operating at a clock frequency of several GHz.

Figure 8:
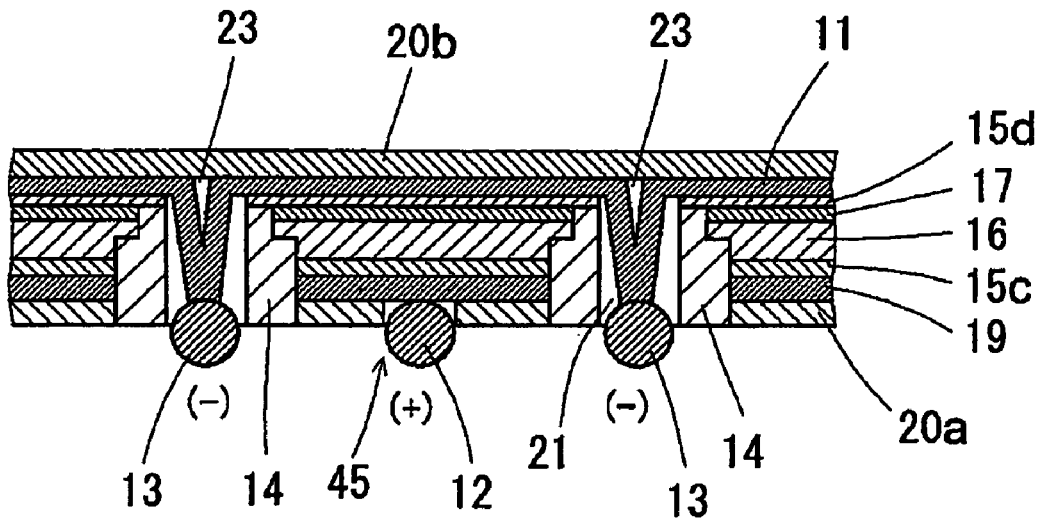
FIG. 8 is an exemplary sectional view showing a thin multi-terminal capacitor according to a second embodiment of this invention.

FIG. 8 is an exemplary sectional view showing a thin multi-terminal capacitor according to the second embodiment of this invention. In this second embodiment, the side of an embossed copper foil 11 serves as a cathode electrode and the side of a copper foil 19 serves as an anode electrode. An aluminum foil 16 is formed in its upper part with an alminum oxide layer and connected to a conductive polymer layer 17 via the alminum oxide layer. The conductive polymer layer 17 is connected to the embossed copper foil 11 via a silver paste layer 15d. An upper surface of the embossed copper foil 11 is covered with an insulating resin 20b. The lower side of the aluminum foil 16 serves as the anode. The aluminum foil 16 is connected to the copper foil 19 via a silver paste layer 15c. The copper foil 19 has a lower surface covered with an insulating resin 20a and connected to solder balls 12 disposed in anode terminal via holes 45 formed in the insulating resin 20a. In FIG. 8, the layers having the same hatching and shown at the same height position are continuous with each other.

In the thin multi-terminal capacitor of the second embodiment, the anode side of the aluminum foil faces toward the mounting surface (solder ball side), while, in the thin multi-terminal capacitor of the first embodiment, the cathode side of the aluminum foil (conductive polymer layer side) faces toward the mounting surface (solder ball side). Therefore, the second embodiment is more advantageous in terms of heat stress. This is because, in consideration of the thermal expansion coefficient at the time of the mounting, the thermal expansion coefficient of aluminum is closer to that of the mounting surface.

Figure 9:
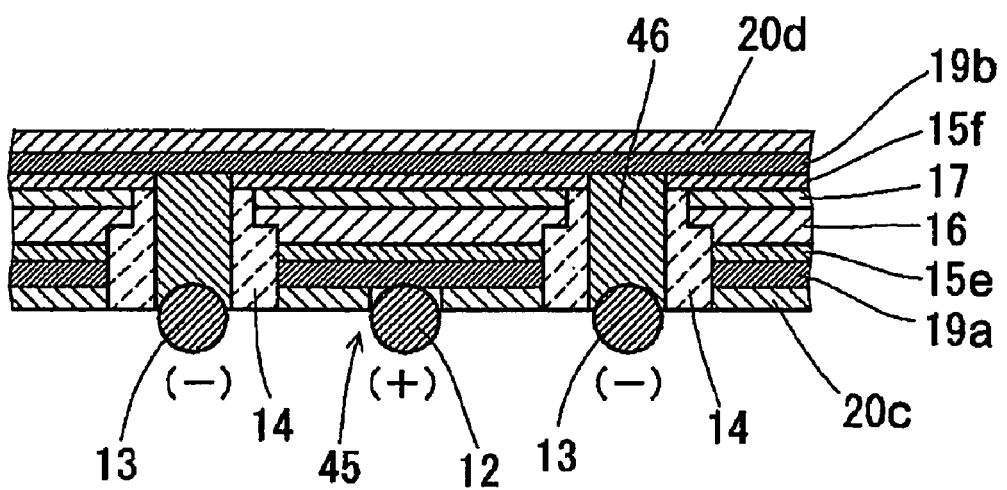
FIG. 9 is an exemplary sectional view showing a thin multi-terminal capacitor according to a third embodiment of this invention.

FIG. 9 is an exemplary sectional view showing a thin multi-terminal capacitor according to the third embodiment of this invention. In this third embodiment, a copper foil 19b and a through-hole copper paste or silver-coated copper paste 46 are used instead of the embossed copper foil 11 in the second embodiment. A silver paste layer 5e and a copper foil 19a are connected to the anode side of an aluminum foil 16. The copper foil 19a has a lower surface covered with an insulating resin 20c and connected to solder balls 12 disposed in anode terminal via holes 45 formed in the insulating resin 20c. On the other hand, a conductive polymer layer 17 is formed on the cathode side of an alminum oxide layer of the aluminum foil 16. The conductive polymer layer 17 is connected to the copper foil 19b via a silver paste layer 15f and further connected to solder balls 13 via the through-hole copper paste 46 filled in holes each of a through-hole insulating resin 14. In FIG. 9, the layers having the same hatching and shown at the same height position are continuous with each other.

This structure facilitates the manufacturing method because it is not necessary to perform matching between the embossed portions and the holes of the through-hole insulating resin. Also in this case, by setting the thickness of the copper foil 19a or 19b to 25 µm or more, it is possible to suppress degradation of the properties due to stress at the time of the mounting.

Now, this invention will be further described in terms of examples.

EXAMPLE 1

A structure of a thin multi-terminal capacitor of Example 1 is the same as that of the first embodiment shown in FIGS. 1A and 1B and a manufacturing method thereof is also the same as that of the first embodiment, and therefore, description thereof is omitted. In Example 1, there was fabricated a solid electrolytic capacitor using a 4×4×0.1 mm aluminum foil as an anode body, having an aluminum oxide layer 16b formed on the surface of inner holes of an etched layer on one side of the aluminum foil, and using a conductive polymer layer 17 on the alminum oxide layer 16b as a solid electrolyte. The overall size of the capacitor is 4×4×0.2 mm and the obtained capacitance is 10 µF. The thickness of an embossed copper foil 11 shown in FIG. 1A is set to 25 µm and the thickness of a copper foil 19 to 25 µm.

EXAMPLE 2

Since a structure of a thin multi-terminal capacitor of Example 2 is substantially the same as that of Example 1, description will be given in comparison therewith. Example 2 differs from Example 1 only in that the thickness of each of an embossed copper foil 11 and a copper foil 19 shown in FIG. 1A is set to 50 µm.

COMPARATIVE EXAMPLE

Since a structure of a thin multi-terminal capacitor of Comparative Example is similar to that of the third embodiment of this invention shown in FIG. 9, description will be given in comparison therewith. In Comparative Example, a resist print layer is formed instead of the copper foil 19a and the insulating resin 20c shown in FIG. 9. Further, there is no copper foil 19b covering substantially the whole surface of the capacitor element and a conductive polymer layer 17 on the cathode side is connected to conductors at through-hole portions via a silver paste layer 15f or a conductive resin such as copper paste. That is, it is the structure in which there is provided no such a member having a mechanically reinforcing function as the reinforcing plate covering substantially the whole surface of the capacitor element and having a thickness of 25 µm or more.

Table 1 shows leakage current characteristics when the thin multi-terminal capacitors thus obtained were mounted by reflow soldering.

TABLE 1

| | Leakage Current (2.5 V applied) | |
|---|---|---|
| Sample | Before Mounting | After Mounting |
| Example 1 | 1.0 µA | 9.5 µA |
| Example 2 | 0.8 µA | 0.85 µA |
| Comparative Example | 35 µA | 1.2 mA |

As seen from Table 1, in the sample of Example 1, although there is an increase in leakage current after the mounting, it is less than 10 µA and there is practically no problem at all. In the sample of Example 2, the leakage current is less than 1 µA even after the mounting. It is understood that the sample of Example 2 is excellent with substantially no change in properties after the mounting. On the other hand, in the same of Comparative Example, the leakage current after the mounting is larger as compared with Examples 1 and 2. The reason is that since the element is thin, the mechanical strength is low against stress during the manufacturing processes of the capacitor, particularly during casing. Further, in the sample of Comparative Example, the properties are degraded to a short level of more than 1 mA, thus being unable to withstand practical use.

On the other hand, when the thickness of the copper foil or embossed copper foil exceeds 500 µm, although there is no problem about degradation in properties due to external stress applied at the time of the fabrication or mounting, there is a problem in disposing the capacitor inside or near the plastic package of the semiconductor device, which is thus not preferable. Note that even when the thickness of each of the copper foil and the embossed copper foil is less than 25 µm, for example, 18 µm, if the surface accuracy of the processing is high, degradation in properties at the time of the mounting is small. However, in consideration of the general surface accuracy, the thickness is preferably 25 µm or more.

While this invention has been described in terms of several embodiments and examples, the invention is not to be limited thereto. This invention includes in its scope a thin multi-terminal capacitor applied with various changes without departing from the gist of this invention and a method of manufacturing such a capacitor. For example, instead of the copper foil, use may be made of a copper alloy foil ensuring conductivity and rigidity. Further, although aluminum is used as the valve-acting metal, this invention is not limited thereto and use may be made of tantalum or niobium. In this case, an anode body is preferably formed by sintering tantalum powder or niobium powder in a vacuum and an oxide layer is preferably formed by a chemical conversion treatment. Further, as a solid electrolyte, use may be made of a metal oxide semiconductor such as manganese dioxide instead of the conductive polymer.

What is claimed is:

1. A thin multi-terminal capacitor comprising:
   a capacitor element including: (i) as an anode, a valve-acting metal in the form of a thin plate, (ii) an oxide layer formed as a dielectric on a surface of said anode, and (iii) a solid electrolyte formed as a cathode on said dielectric; and
   a reinforcing electrode plate on at least one side of said capacitor element for suppressing deformation of said capacitor element, the reinforcing electrode plate also serving as electrode terminals disposed in an array for electrically connecting to said capacitor element.

2. A thin multi-terminal capacitor according to claim 1, wherein the capacitor includes anode terminals and cathode terminals formed on one side of said capacitor element and, with respect to an x-axis and a y-axis perpendicular to each other in a plane, the anode terminals and the cathode terminals are alternately formed at a same pitch in the direction of said x-axis, and the anode terminals and the cathode terminals are alternately formed in the direction of said y-axis at the same pitch, which is equal to the pitch along said x-axis, so that heteropolar terminals are disposed at adjacent positions with respect to any one of the terminals.

3. A thin multi-terminal capacitor according to claim 1, wherein said reinforcing plate has a size that covers substantially the whole surface of said capacitor element on said one side.

4. A thin multi-terminal capacitor according to claim 1, wherein said reinforcing electrode plate comprises copper.

5. A thin multi-terminal capacitor according to claim 4, wherein said valve-acting metal is aluminum and said reinforcing electrode plate has a thickness of 25 to 500 µm.

6. A thin multi-terminal capacitor according to claim 4, wherein said reinforcing electrode plate is disposed on a first side of said capacitor element, and comprises a copper plate or a copper foil having embossed portions arranged at regular intervals; and
   wherein convex portions of said embossed portions are fitted into holes formed in said capacitor element at said regular intervals, so as to form electrodes drawn to a surface on a second side of the capacitor element, which is opposite to the first side.

7. A thin multi-terminal capacitor according to claim 1, wherein said reinforcing plate comprises a composite plate which has a thickness of 25 to 500 µm and which comprises a copper plate or a copper foil and an insulating resin.

8. A thin multi-terminal capacitor, comprising:
   a stacked structure including an anode made of a valve-acting metal in the form of a thin plate, an oxide layer formed on a surface of said valve-acting metal, and a cathode including a solid electrolyte layer formed on said oxide layer;
   multi-terminal electrodes including anode terminal electrodes and cathode terminal electrodes which are arranged in arrays on one surface of said stacked structure; and
   a conductive reinforcing plate disposed on at least one side of said stacked structure for suppressing deformation of said thin multi-terminal capacitor;
   wherein either of said anode terminal electrodes and said cathode terminal electrodes comprise projecting portions of said conductive reinforcing plate which are embossed in arrays and disposed in through holes which are formed across said stacked structure and arranged in arrays.

9. A thin multi-terminal capacitor according to claim 8, wherein, in a plane including an x-axis and a y-axis perpendicular to each other, said anode terminal electrodes and said cathode terminal electrodes are alternately disposed in the x-direction at a same interval, and said anode terminal electrodes and said cathode terminal electrodes are alternately disposed in the y-direction at the same interval, which is equal to the interval in the x-direction, so that heteropolar terminal electrodes are disposed at adjacent positions with respect to any one of said terminal electrodes.

10. A thin multi-terminal capacitor according to claim 8, wherein said anode terminal electrodes comprise the projecting portions of said conductive reinforcing plate;
    wherein said stacked structure comprises:
       a second conductive reinforcing plate disposed on a side opposite to said conductive reinforcing plate; and
       an insulating resin thin film formed on said second conductive reinforcing plate; and
    wherein said cathode terminal electrodes are formed in via holes formed in said insulating resin thin film.

11. A thin multi-terminal capacitor according to claim 8, wherein said cathode terminal electrodes comprise the projecting portions of said conductive reinforcing plate;
    wherein said stacked structure comprises:
       a second conductive reinforcing plate disposed on a side opposite to said conductive reinforcing plate; and
       an insulating resin thin film formed on said second conductive reinforcing plate; and
    wherein said anode terminal electrodes are formed in via holes formed in said insulating resin thin film.

12. A thin multi-terminal capacitor according to claim 8, wherein said conductive reinforcing plate comprises a copper plate or a copper foil.

13. A thin multi-terminal capacitor according to claim 12, wherein said conductive reinforcing plate has a thickness of 25 to 500 µm.

14. A thin multi-terminal capacitor according to claim 8, wherein said cathode terminal electrodes are disposed in the through holes formed across said stacked structure and arranged in arrays.

15. A thin multi-terminal capacitor according to claim 14, wherein said stacked structure comprises:
- a second conductive reinforcing plate disposed on a side opposite to said conductive reinforcing plate; and
- an insulating resin thin film formed on said second conductive reinforcing plate; and
- wherein said anode terminal electrodes are formed in via holes formed in said insulating resin thin film.

16. A thin multi-terminal capacitor manufacturing method comprising:
- forming holes at regular intervals in a valve-acting metal plate having oxide layers formed on both surfaces thereof;
- filling said holes with a first resist resin;
- forming a mask layer covering said first resist resin;
- forming a conductive polymer layer on an exposed surface of a first one of said oxide layers;
- stripping said mask layer to expose surfaces of said first resist resin;
- connecting, via a silver paste layer, a composite foil comprising a first copper foil and an insulating resin film to said conductive polymer layer such that said first copper foil faces toward said conductive polymer layer, said first copper foil being formed with through holes arranged corresponding to the surfaces of said first resist resin, and said insulating resin film being formed with holes arranged to correspond to positions of said through holes and middle points between adjacent through holes;
- filling the holes provided in a composite layer including said insulating resin film, said first copper foil, said silver paste layer, and said conductive polymer layer stacked together, with a second resist resin made of material that is the same as a material of which said first resist resin is made;
- removing a second one of said oxide layers, which is on a side of said valve-acting metal plate opposite to said conductive polymer layer, so as to expose a valve-acting metal core;
- forming through holes at the centers of each of said first and second resist resins; and
- mounting a second copper foil having concave-convex portions formed by emboss processing corresponding to the positions of said through holes, to an exposed surface of said valve-acting metal via a silver paste layer at a flat portion of said second copper foil such that said concave-convex portions of said second copper foil are inserted into the through holes, which are provide provided in a composite layer including said insulating resin film, said first copper foil, said silver paste layer, said conductive polymer layer, said oxide layer, and said valve-acting metal core.

* * * * *